(12) United States Patent
Tahara et al.

(10) Patent No.: US 9,126,229 B2
(45) Date of Patent: Sep. 8, 2015

(54) DEPOSIT REMOVAL METHOD

(75) Inventors: Shigeru Tahara, Miyagi (JP); Eiichi Nishimura, Miyagi (JP); Hiroshi Tomita, Tokyo (JP); Tokuhisa Ohiwa, Tokyo (JP); Hisashi Okuchi, Tokyo (JP); Mitsuhiro Omura, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 5 days.

(21) Appl. No.: 14/116,952

(22) PCT Filed: May 10, 2012

(86) PCT No.: PCT/JP2012/003070
§ 371 (c)(1),
(2), (4) Date: Dec. 12, 2013

(87) PCT Pub. No.: WO2012/153534
PCT Pub. Date: Nov. 15, 2012

(65) Prior Publication Data
US 2014/0083979 A1  Mar. 27, 2014

(30) Foreign Application Priority Data
May 11, 2011  (JP) .................. 2011-106464

(51) Int. Cl.
*B05D 3/14* (2006.01)
*H01L 21/02* (2006.01)
*H01L 21/311* (2006.01)

(52) U.S. Cl.
CPC .......... *B05D 3/145* (2013.01); *H01L 21/02057* (2013.01); *H01L 21/02063* (2013.01); *H01L 21/31116* (2013.01)

(58) Field of Classification Search
CPC ................................................ H01L 21/02063
See application file for complete search history.

(56) References Cited

U.S. PATENT DOCUMENTS 5,078,832 A  1/1992  Tanaka
5,439,553 A  8/1995  Grant et al.
(Continued)

FOREIGN PATENT DOCUMENTS

CN  1734724 A  2/2006
DE  697 04 539 T2  10/2001
(Continued)

OTHER PUBLICATIONS

International Search Report mailed Jul. 10, 2012 in PCT/JP2012/003070.
(Continued)

*Primary Examiner* — Shamim Ahmed
*Assistant Examiner* — Bradford Gates
(74) *Attorney, Agent, or Firm* — Rothwell, Figg, Ernst & Manbeck, P.C.

(57) ABSTRACT

A deposit removal method for removing deposits deposited on the surface of a pattern formed on a substrate by etching, includes an oxygen plasma treatment process for exposing the substrate to oxygen plasma while heating the substrate and a cycle treatment process for, after the oxygen plasma treatment process, repeating multiple cycles of a first period and a second period. In the first period, the substrate is exposed to a mixture of hydrogen fluoride gas and alcohol gas inside a processing chamber and the partial pressure of the alcohol gas is set to the first partial pressure. In the second period, the partial pressure of the alcohol gas is set to the second partial pressure lower than the first partial pressure by exhausting the inside of the processing chamber.

8 Claims, 14 Drawing Sheets

(56) References Cited

U.S. PATENT DOCUMENTS

| | | | |
|---|---|---|---|
| 5,620,559 A | 4/1997 | Kikuchi | |
| 6,124,209 A | 9/2000 | Habuka et al. | |
| 6,379,574 B1 | 4/2002 | Ou-Yang et al. | |
| 2002/0074312 A1 | 6/2002 | Ou-Yang et al. | |
| 2006/0011580 A1 | 1/2006 | Shimizu | |
| 2006/0207968 A1* | 9/2006 | Mumbauer et al. | 216/58 |
| 2008/0099440 A1 | 5/2008 | Hayashi | |
| 2008/0178914 A1 | 7/2008 | Hayashi | |
| 2008/0291524 A1* | 11/2008 | Ishil et al. | 359/290 |
| 2009/0275202 A1 | 11/2009 | Tanaka et al. | |
| 2009/0302001 A1* | 12/2009 | Mayers et al. | 216/54 |
| 2009/0308843 A1* | 12/2009 | O'Hara | 216/67 |
| 2011/0228370 A1 | 9/2011 | Tsai et al. | |

FOREIGN PATENT DOCUMENTS

| | | |
|---|---|---|
| EP | 0 848 088 A1 | 6/1998 |
| FR | 2 717 503 A1 | 3/1995 |
| GB | 2 287 826 A | 9/1995 |
| JP | 63-5532 A | 1/1988 |
| JP | 3-80538 A | 4/1991 |
| JP | 5-304122 A | 11/1993 |
| JP | 6-84852 A | 3/1994 |
| JP | 7-263416 A | 10/1995 |
| JP | 7-335602 A | 12/1995 |
| JP | 8-81788 A | 3/1996 |
| JP | 10-233380 A | 9/1998 |
| JP | 2000-49227 A | 2/2000 |
| JP | 2001-7093 A | 1/2001 |
| JP | 2006-12940 A | 1/2006 |
| JP | 2007-115795 A | 5/2007 |
| JP | 2008-117867 A | 5/2008 |
| JP | 2008-186865 A | 8/2008 |
| KR | 10-2006-0046505 A | 5/2006 |
| TW | 418444 | 1/2001 |
| TW | 558765 | 10/2003 |

OTHER PUBLICATIONS

International Search Report issued Dec. 18, 2012 for PCT/JP2012/006091 filed Sep. 25, 2012 with English translation (7 pages).

International Written Opinion issued Dec. 18, 2012 for PCT/JP2012/006091 filed Sep. 25, 2012 (4 pages).

Office Action mailed Oct. 8, 2014 in co-pending U.S. Appl. No. 14/222,762, filed Mar. 24, 2014 (11 pages).

* cited by examiner

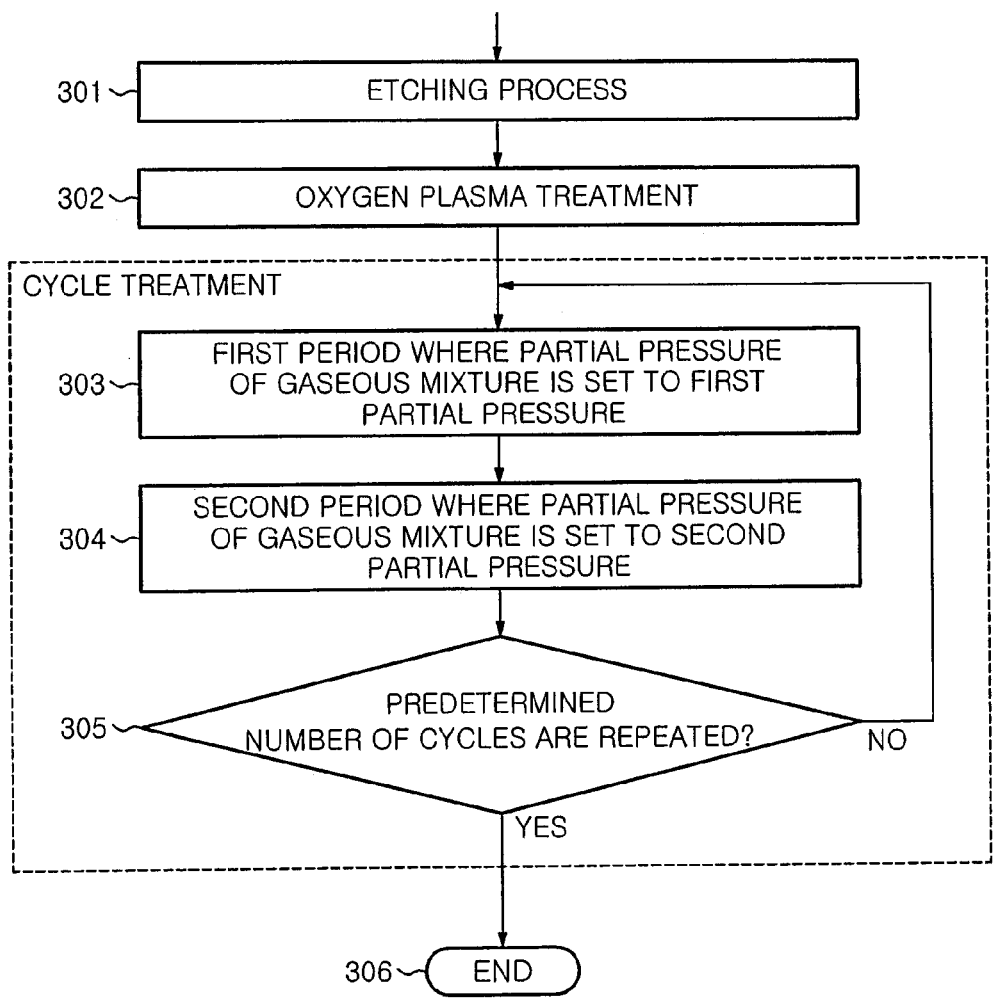

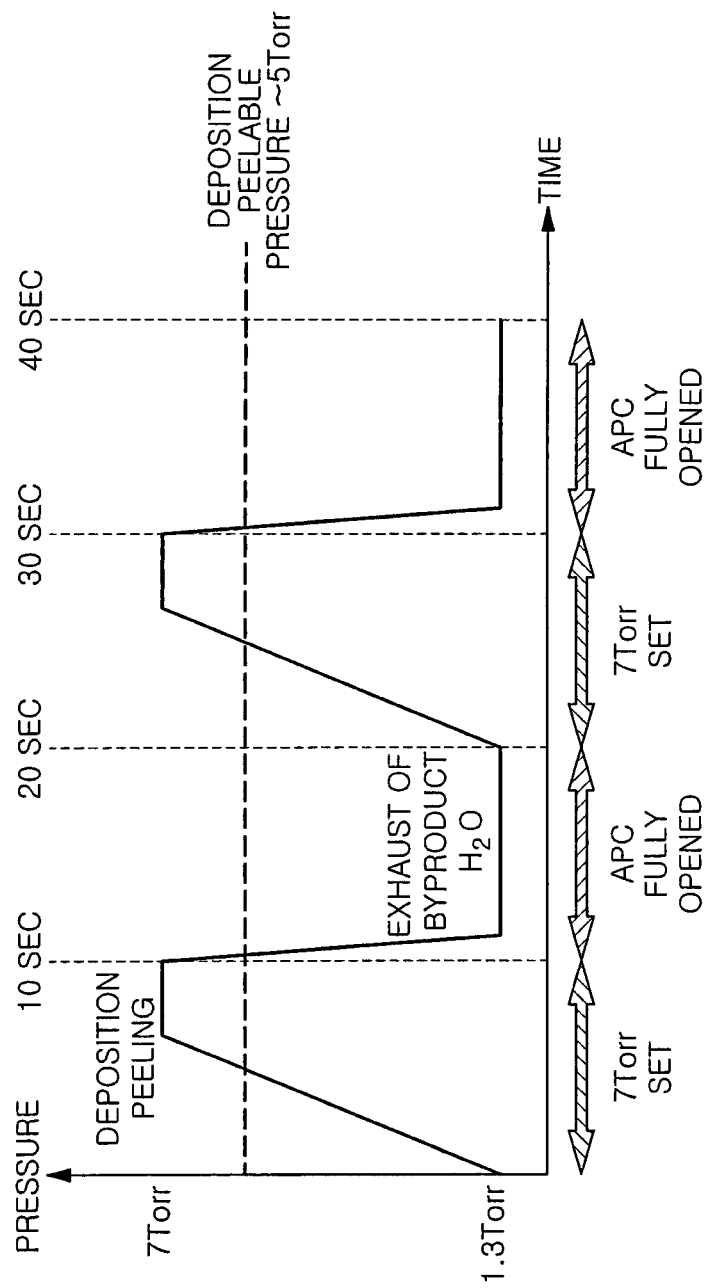

DEPOSIT REMOVAL METHOD

CROSS REFERENCE TO RELATED APPLICATION

This application is a 35 U.S.C. 371 National Phase Entry Application from PCT/JP2012/003070, filed May 10, 2012, which claims the benefit of Japanese Patent Application No. 2011-06464, filed May 11, 2011, the disclosures of which are incorporated herein in their entirety by reference.

FIELD OF THE INVENTION

The present invention relates to a deposit removal method.

BACKGROUND OF THE INVENTION

Conventionally, in a semiconductor device manufacturing field, a desired pattern is formed on a substrate such as a semiconductor wafer or the like by performing film formation or etching. In such a semiconductor device manufacturing process, if an STI (Shallow Trench Isolation) process is carried out, deposits of silicon oxide (e.g., $SiO_2$ or SiOBr) are deposited on a sidewall of the pattern. In a conventional case, such deposits are removed by a process using, e.g., a single gas of HF (hydrogen fluoride).

However, when a composition or a bonding state of deposits is similar to that of silicon dioxide (e.g., a gate oxide film) as a structure in a pattern, the selectivity therebetween is not obtained. Moreover, water as a by-product generated by the reaction between the deposits and HF ($SiO_2 + 4HF \rightarrow SiF_4 + 2H_2O$) accelerates the reaction. Thus, the chain reaction occurs, and the silicon dioxide as a structure in the pattern may be etched as well as the deposits.

If the exposure time (q-time) after the etching process is increased, the selectivity may deteriorate further due to the effects of moisture depending on the moisture absorbing state of the deposits. As for a technique for removing a natural oxide film formed on a surface of a silicon substrate, there is known a technique using HF vapor, $H_2O$ vapor or alcohol vapor (see, e.g., Japanese Patent Application Publication No. H07-263416). However, this technique is used for removing a natural oxide film, but not for removing deposits deposited on a sidewall portion of a pattern.

As described above, in a conventional case, when deposits deposited on a pattern are removed, the selectivity between the deposits and the silicon dioxide as the structure in the pattern is low, and the silicon dioxide as the structure in the pattern is damaged. If the exposure time (q-time) after the etching process is increased, the selectivity deteriorates further due to the effects of moisture depending on the moisture absorbing state of the deposits.

SUMMARY OF THE INVENTION

In view of the above, the present invention provides a deposit removal method capable of effectively removing deposits regardless of a length of exposure time after etching and reducing damages to silicon dioxide as a structure in a pattern.

In accordance with an aspect of the present invention, there is provided a deposit removal method for removing deposits deposited on a surface of a pattern formed on a substrate by etching, the method including: an oxygen plasma treatment process for exposing the substrate to an oxygen plasma while heating the substrate; and a cycle treatment process for, after the oxygen plasma treatment process, repeating multiple cycles of a first period, in which the substrate is exposed to a mixture of hydrogen fluoride gas and alcohol gas in a processing chamber and a partial pressure of the alcohol gas is set to a first partial pressure, and a second period in which a partial pressure of the alcohol gas is set to a second partial pressure lower than the first partial pressure by exhausting the inside of the processing chamber.

Effects of the Invention

In accordance with the present invention, it is possible to provide a deposit removal method capable of effectively removing deposits regardless of a length of exposure time after etching and reducing damages to silicon dioxide as a structure in a pattern.

BRIEF DESCRIPTION OF THE DRAWINGS

FIG. 3 is a flowchart showing a process of an embodiment of the present invention.

FIG. 4 is a graph showing a pressure change state in an embodiment of the present invention.

DETAILED DESCRIPTION OF THE EMBODIMENTS

Hereinafter, an embodiment of the present invention will be described with reference to the accompanying drawings.

Figure 1:
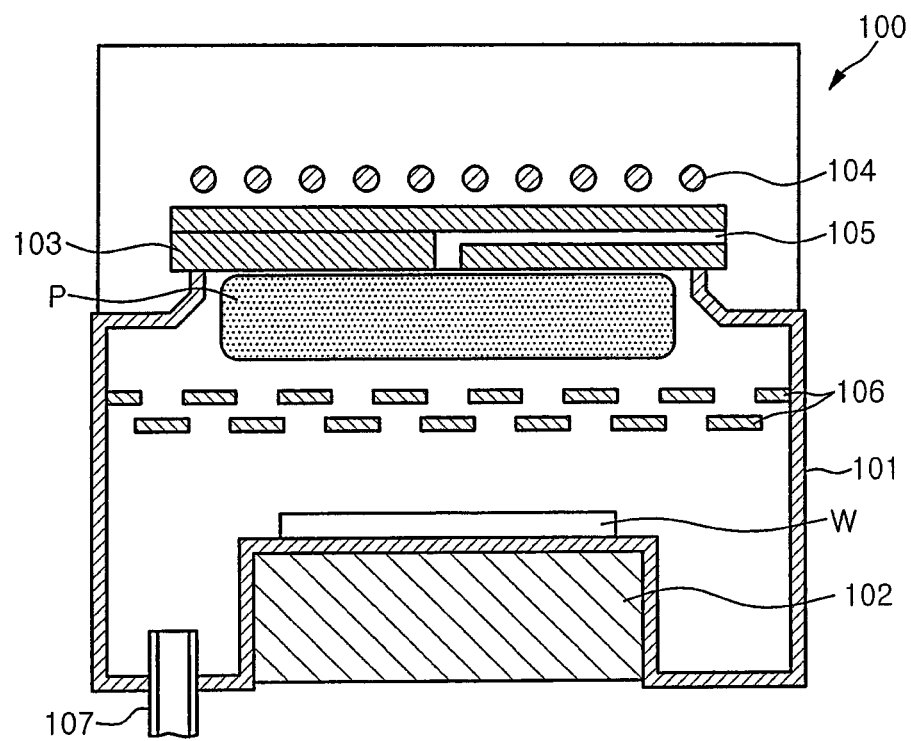
FIG. 1 shows a cross sectional schematic configuration of a plasma processing apparatus used in an embodiment of the present invention.

FIG. 1 is a vertical cross sectional view schematically showing a configuration example of a plasma processing apparatus 100 used in an oxygen plasma treatment process in a deposit removal method in accordance with an embodiment of the present invention. As illustrated in FIG. 1, the plasma processing apparatus 100 includes an airtightly sealable processing chamber 101. Provided in the processing chamber 101 is a stage 102 for mounting thereon a semiconductor wafer (substrate) W. The stage 102 has a temperature control unit (not shown), and a temperature of the semiconductor wafer W mounted on the stage 102 can be maintained at a predetermined temperature.

The processing chamber 101 is made of, e.g., quartz or the like, and a window 103 made of quartz is formed at a ceiling portion thereof. Further, an RF coil 104 connected to a high frequency power supply (not shown) is provided at an outer side of the window 103. Provided in the window 103 is a gas inlet 105 for introducing a predetermined processing gas containing oxygen gas (e.g., a single gas of $O_2$ gas) into the processing chamber 101. Moreover, a plasma P of the processing gas introduced through the gas inlet 105 is generated by the action of the high frequency power supplied to the RF coil 104.

Provided below the window 103 is a gas diffusion plate 106 for shielding a plasma and dispersing a gas. Radicals in the plasma are dispersed through the gas diffusion plate 106 and supplied to the semiconductor wafer W on the stage 102. When the plasma acts on the substrate, the plasma may be brought into direct contact with the substrate. Or, as in the present embodiment, a remote plasma process may be performed. In other words, instead of bringing the plasma into direct contact with the substrate, radicals extracted from the plasma generated at a portion separated from the substrate may act on the substrate.

In addition, a gas exhaust line 107 is provided at a bottom portion of the processing chamber 101. The gas exhaust line 107 is connected to a vacuum pump (not shown) or the like, and the inside of the processing chamber 101 can be exhausted to a predetermined pressure.

Figure 2:
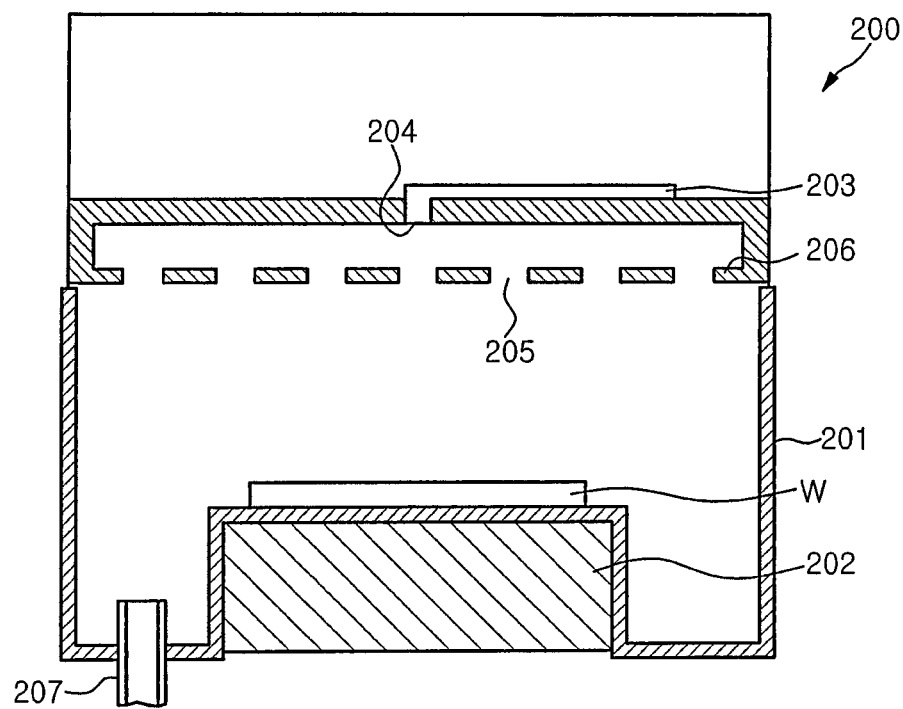
FIG. 2 shows a cross sectional schematic configuration of a gas processing apparatus used in an embodiment of the present invention.

FIG. 2 is a vertical cross sectional view schematically showing a configuration example of a gas processing apparatus 200 used in a cycle treatment process in the deposit removal method in accordance with an embodiment of the present invention. As illustrated in FIG. 2, the gas processing apparatus 200 includes an airtightly sealable processing chamber 201. Provided in the processing chamber 201 is a stage 202 for mounting thereon a semiconductor wafer (substrate) W. The stage 202 has a temperature control unit (not shown), and a temperature of the semiconductor wafer W mounted on the stage 202 can be maintained at a predetermined temperature.

Provided at an upper portion of the processing chamber 201 is a gas inlet 203 for introducing a predetermined processing gas (a mixture of HF gas and methanol gas in the present embodiment) into the processing chamber 201. Moreover, a gas diffusion plate 206 having a plurality of through holes 205 is provided below an opening 204 where the gas inlet 203 opens to the processing chamber 201. The processing gas is supplied to the surface of the semiconductor wafer W while being uniformly distributed through the through holes 205 of the gas diffusion plate 206.

Further, a gas exhaust line 207 is provided at the bottom portion of the processing chamber 201. The gas exhaust line 207 is connected to a vacuum pump (not shown) or the like, and the inside of the processing chamber 201 can be exhausted to a predetermined pressure.

In the present embodiment, the deposit removal process is performed in the following manner by using the plasma processing apparatus 100 and the gas processing apparatus 200 having the above-described configurations.

As shown in the flowchart of FIG. 3, the etching process is performed in the previous step (step 301), and deposits generated by the etching process (so-called deposits) are deposited on a sidewall portion of a predetermined pattern of the semiconductor wafer W. For example, when an STI (Shallow Trench Isolation) process is carried out, deposits of silicon oxide (e.g., $SiO_2$ or SiOBr) are deposited on the sidewall portion of the pattern. Here, the deposits deposited on the sidewall portion of the pattern are removed by the deposit removal process of the present embodiment.

The etching process (step 301) is performed by, e.g., the following two steps.

(Step 1)
Pressure: 6.65 Pa (50 mTorr)
High frequency power (high frequency power having a higher frequency)/(high frequency power having a lower frequency): 400/1500 W
Etching gas: $HBr/NF_3/O_2$=400/75/5 sccm
Stage temperature: 110° C.
Time: 5 sec (Step 2)
Pressure: 6.65 Pa (50 mTorr)
High frequency power (high frequency power having a higher frequency)/(high frequency power having a lower frequency): 400/1400 W
Etching gas: $HBr/NF_3/O_2$=350/32/19 sccm
Stage temperature: 110° C.
Time: 20 sec After the etching process, an oxygen plasma treatment in the deposit removal process is carried out (step 302). The oxygen plasma treatment may be performed by the plasma processing apparatus 100 shown in FIG. 1 or the like. The deposit removal process may be performed immediately after the etching process or may be performed after a certain period of exposure time (q-time) (e.g., about a few hours to a few days) after the etching process.

In the processing apparatus 100, the oxygen plasma treatment step is carried out in the following manner, for example. Specifically, in the oxygen plasma treatment step, a semiconductor wafer W is mounted on the stage 102 that has been previously set to a predetermined temperature. The semiconductor wafer W is attracted and held by an electrostatic chuck (not shown) or the like and heated to a predetermined temperature. In that state, a predetermined processing gas containing oxygen gas is introduced through the gas inlet 105, and the exhaust is performed through the gas exhaust line 107. Accordingly, the inside of the processing chamber 101 is set to a processing gas atmosphere at a predetermined pressure. Further, an inductively coupled plasma of $O_2$ gas is generated by applying the high frequency power to the RF coil 104. Ions in the plasma are shielded by the gas diffusion plate 106, and oxygen radicals without charges are dispersed and supplied to the semiconductor wafer W on the stage 102. As a consequence, an oxygen plasma treatment is carried out by the action of the oxygen radicals.

The oxygen plasma treatment is carried out regardless of the length of exposure time (q-time) after the etching process in order to obtain a uniform pattern and a constant moisture absorbing state of deposits (dehydration). Accordingly, in the cycle treatment process to be performed later, the silicon oxide (e.g., $SiO_2$ or SiOBr) as deposits deposited on the sidewall of the pattern can be removed by eliminating the influence due to the difference in the moisture absorbing state. Further, the damages to a $SiO_2$ layer such as a gate oxide film or the like as a pattern structure, which is caused by excessive reaction, can be reduced.

In the oxygen plasma treatment, a gas containing oxygen, e.g., a single gas of oxygen gas or a mixture of oxygen gas and nitrogen gas, is used as the processing gas, and the heating temperature (stage temperature) of the semiconductor wafer W is set to, e.g., about 200° C. to 300° C. Besides, the pressure is set to, e.g., about 66.5 Pa (0.5 Torr) to 266 Pa (2 Torr).

After the oxygen plasma treatment, the cycle treatment in the deposit removal process is carried out (steps 303 to 305). The cycle treatments may be performed by the gas processing apparatus 200 shown in FIG. 2 or the like.

In the gas processing apparatus 200, the cycle treatment process is carried out in the following manner. Specifically, in the cycle treatment process, the semiconductor wafer W is mounted on the stage 202 that has been previously set to a predetermined temperature and maintained at the predetermined temperature. In that state, a predetermined processing gas (mixture of HF gas and methanol gas in the present embodiment) is introduced through the gas inlet 203, and the exhaust is performed through the exhaust pipe 207. Accordingly, the inside of the processing chamber 201 is set to a processing gas atmosphere at a predetermined pressure.

As shown in the flowchart of FIG. 3, in the cycle treatment process, a first period in which a partial pressure of methanol gas is set to a first partial pressure (step 303) and a second period in which a partial pressure of the methanol gas is set to a second partial pressure lower than the first partial pressure by exhausting the inside of the processing chamber (step 304) are repeated multiple cycles (step 305). As for the method for changing the partial pressure of the methanol gas, the following manner may be used, for example.

Specifically, there is used a method for changing a gas supply state, e.g., a method for supplying a gaseous mixture at a predetermined flow rate in the first period and stopping the supply of the gaseous mixture and supplying a nitrogen gas at a predetermined flow rate in the second period, or a method for maintaining a pressure in the processing chamber to a predetermined level by using an automatic pressure controller (APC) while supplying a gaseous mixture at a predetermined flow rate in the first period and lowering the pressure by performing exhaust of the vacuum pump while decreasing a setting pressure of the automatic pressure controller or fully opening the automatic pressure controller in the second period. In the present embodiment, the first period and the second period are set by using the latter method as shown in the graph of FIG. 4.

At this time, it is preferable to set the temperature of the semiconductor wafer W to a low level of, e.g., about several tens of degrees (e.g., about 30° C.) or less. The pressure in the first period is preferably, e.g., about 665 Pa (5 Torr) to 1330 Pa (10 Torr). As for the processing gas, a mixture of HF gas and alcohol gas ($CH_3OH$ gas in the present embodiment) is used.

In the first period of the cycle treatment, a partial pressure of the methanol gas is set to a level at which deposits can be removed by the action of the gaseous mixture. In the second period, the partial pressure of the methanol gas is decreased so that the deposits are not removed and substances ($H_2O$ and the like) generated by the reaction between the gaseous mixture and the deposits in the first period are discharged to the outside of the processing chamber 201. The first and the second period are each set to about 5 to 20 sec and this cycle is repeated multiple times.

After the cycle treatment is repeated predetermined number of times, the deposit removal process is completed (step 306).

As described above, in the deposit removal method of the present embodiment, first, the pattern and the moisture absorbing state of the deposit are maintained by the oxygen plasma treatment regardless of the length of the exposure time (q-time) after the etching process.

If the oxygen plasma treatment is carried out, it is difficult to remove deposits by the process using a HF single gas. Therefore, in the cycle treatment of the present embodiment, a mixture of HF gas and alcohol gas (methanol gas in the present embodiment) is used. In that case, the amount of $H_2O$ generated by the reaction becomes excessive, so that a gate oxide film or the like as a pattern structure may be damaged or the deposition (re-deposition) may occur by reverse reaction. Therefore, the amount of $H_2O$ is prevented from becoming excessive by repeating the cycle of the first period in which the deposits are removed and the second period in which the reaction product is exhausted without removing deposits.

Accordingly, silicon oxide (e.g., $SiO_2$ or $SiOBr$) as deposits deposited on the sidewall of the pattern can be removed. Further, it is possible to suppress excessive progress of the reaction due to the catalytic action of $H_2O$ and reduce damages to the $SiO_2$ layer such as a gate oxide film or the like as a pattern structure.

In a test example, the deposit removal process was performed on a semiconductor wafer that has been subjected to pattern formation by etching and left for one month. First, the oxygen plasma treatment was carried out under the following processing conditions.

Pressure: 133 Pa (1 Torr)
High frequency power: 1000 W
Etching gas: $O_2$=1980 sccm
Stage temperature: 250° C.
Time: 120 sec Next, the cycle treatment was performed under the following processing conditions.

Pressure: (931 Pa (7 Torr) for 10 sec ⇔ 173 Pa (1.3 Torr) for 10 sec)×6 cycles
$HF/CH_3OH$=2800/44 sccm
Stage temperature: 10° C.

In the cycle treatment, as described above, the state in which the setting pressure of the APC is set to 931 Pa (7 Torr) is maintained for 10 sec in the first period, and the state in which the APC is fully opened while supplying the processing gas is maintained for 10 sec in the second period. The actual fluctuation of the pressure in the processing chamber 201 is shown in the graph of FIG. 4. Specifically, even if the setting pressure of the APC is set to 931 Pa (7 Torr) from the state where the APC is fully opened, about 4 to 5 sec is required until the pressure actually reaches 931 Pa (7 Torr). Further, if the APC is fully opened from the state where the setting pressure of the APC is 931 Pa (7 Torr), the pressure is maintained at a constant level of about 173 Pa (1.3 Torr) within a comparatively short period of time.

Here, under the above-described conditions of the stage temperature and the flow rate of the processing gas, the pressure as the partial pressure of the methanol gas at which the deposits can be removed (deposition peeling) is about 665 Pa (5 Torr). Therefore, the period of time of the ½ cycle in the cycle treatment is preferable set to about 5 to 20 sec. Further, the first and the second period are not necessarily the same and may be different from each other.

Figure 5A:
FIGS. 5A to 5C are electron microscope images showing pattern states in test examples.
Figure 5B:
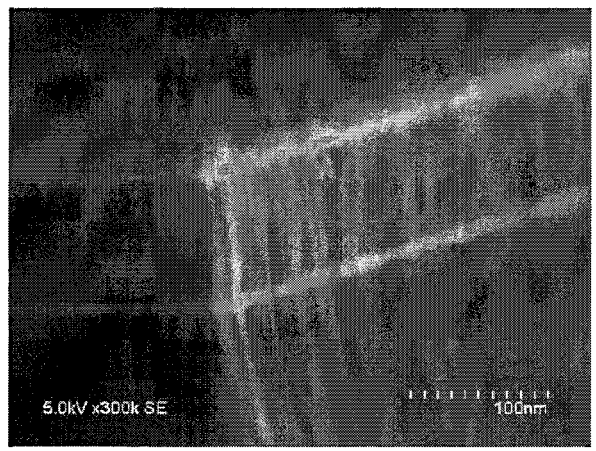
Figure 5C:
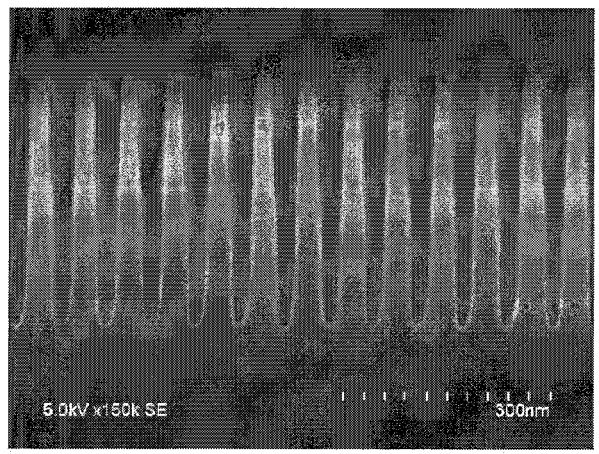

The semiconductor wafer that has been subjected to the deposit removal process was enlarged and observed by a SEM (Scanning Electron Microscope). As a result, it was found that the deposits deposited on the sidewall portion of the pattern were removed and the $SiO_2$ layer such as a gate oxide film or the like as a pattern structure was not damaged. FIGS. 5A to 5C show electron microscope images of the test example.

Figure 6A:
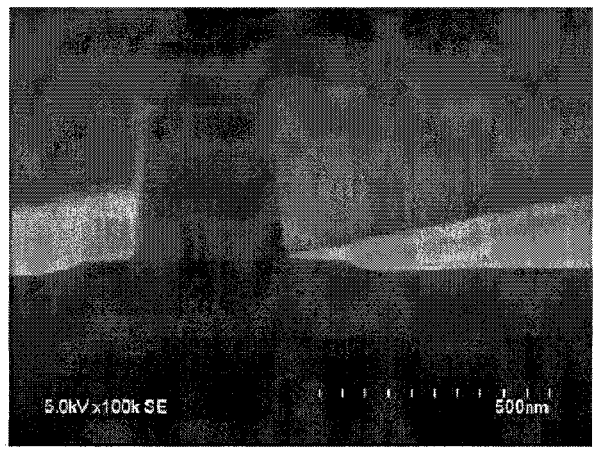
FIGS. 6A to 6C are electron microscope images showing pattern states in comparative examples.
Figure 6B:
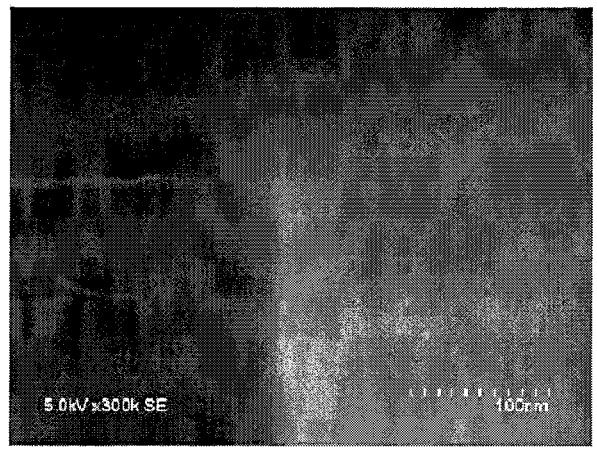
Figure 6C:
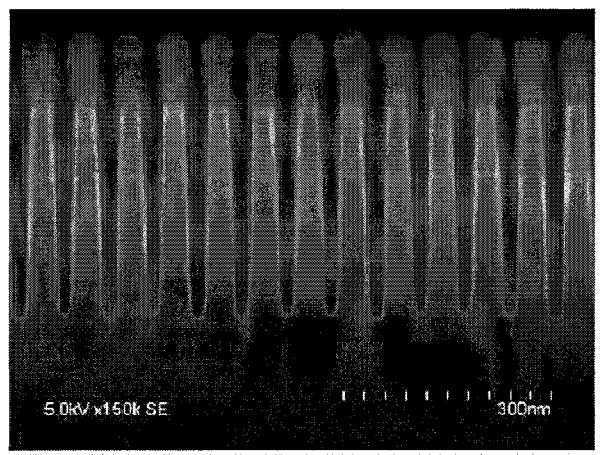

Meanwhile, in a comparative example, the same gas processing as that performed in the test example was performed by using a HF single gas after the oxygen plasma treatment of the test example. As a result, the deposits were hardly removed. FIGS. 6A to 6C show electron microscope images of the comparative example. The comparison between the electron microscope images of the test example of FIGS. 5A to 5C and those of the comparative example of FIGS. 6A to 6C shows that in the test example of FIGS. 5A to 5C, the gate oxide film is visible as a white line because the deposits of the pattern sidewall have been removed, but in the comparative example of FIGS. 6A to 6C, the gate oxide film is not visible as a white line because the deposits of the pattern sidewall have not been removed.

Figure 7A:
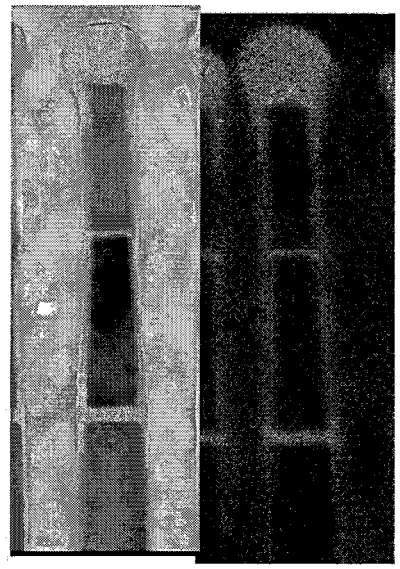
FIGS. 7A to 7C are electron microscope images showing states before and after deposit removal in the test examples and the comparative examples.
Figure 7B:
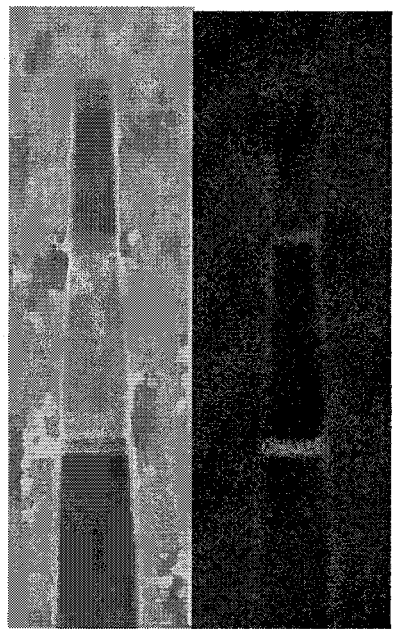
Figure 7C:
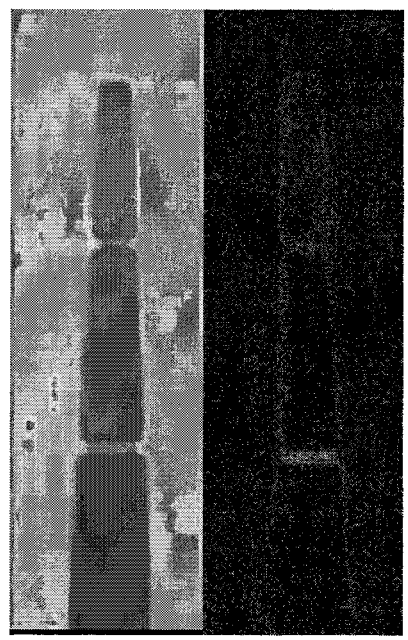

FIGS. 7A to 7C show electron microscope images of the pattern (left sides in the drawings) and oxygen maps (right sides in the drawings) obtained by EELS (Electron Energy-Loss Spectroscopy). FIG. 7A shows the pattern after the etching (before the removal of deposits), and FIG. 7B shows the pattern after the removal of deposits in the test example. As can be seen from the electron microscope images, in the test example, the deposits deposited on the sidewall portion of the pattern are completely removed and the damages to the gate oxide film as the structure of the pattern by the etching is suppressed. FIG. 7C shows the case in which the deposits are removed by the treatment using a HF single gas. In that case, it is clear that the damages occur by the etching of the gate oxide film as the structure of the pattern.

Hereinafter, the result of examining conditions of the processing which can remove deposits will be described. First, the relationship between the amount of the methanol gas added to the processing gas and the peeling force of deposits was examined. As a result, it was found that the deposits were not removed in the sample in which the methanol gas was not added. However, it was found that the deposits could be removed by adding the methanol gas of 100 sccm. Further, it was found that the peeling force of deposits was increased by increasing the addition amount of the methanol gas to 200 sccm. However, in this test, the gas treatment was consecutively performed without performing the cycle treatment. Therefore, the gate oxide film as the structure of the pattern was etched and damaged.

In order to examine the relationship between the pressure of the processing gas and the peeling force of the deposits, the deposits of the sample were removed by setting the pressure to 665 Pa (5 Torr), 1330 Pa (10 Torr), and 1995 Pa (15 Torr). As a result, it was found that the peeling force of the deposits was increased by increasing the pressure. However, in this test, the gas treatment was consecutively performed without performing the cycle treatment. Therefore, the gate oxide film as the structure of the pattern was etched and damaged.

In order to examine the relationship between the temperature and the peeling force of the deposits, the deposits of the sample were removed by setting the temperature to 10° C., 30° C. and 50° C. As a result, it was found that the peeling force of the deposits was increased by decreasing the temperature. However, in this test, the gas treatment was consecutively performed without performing the cycle treatment. Therefore, the gate oxide film as the structure of the pattern was etched and damaged.

Figure 8:
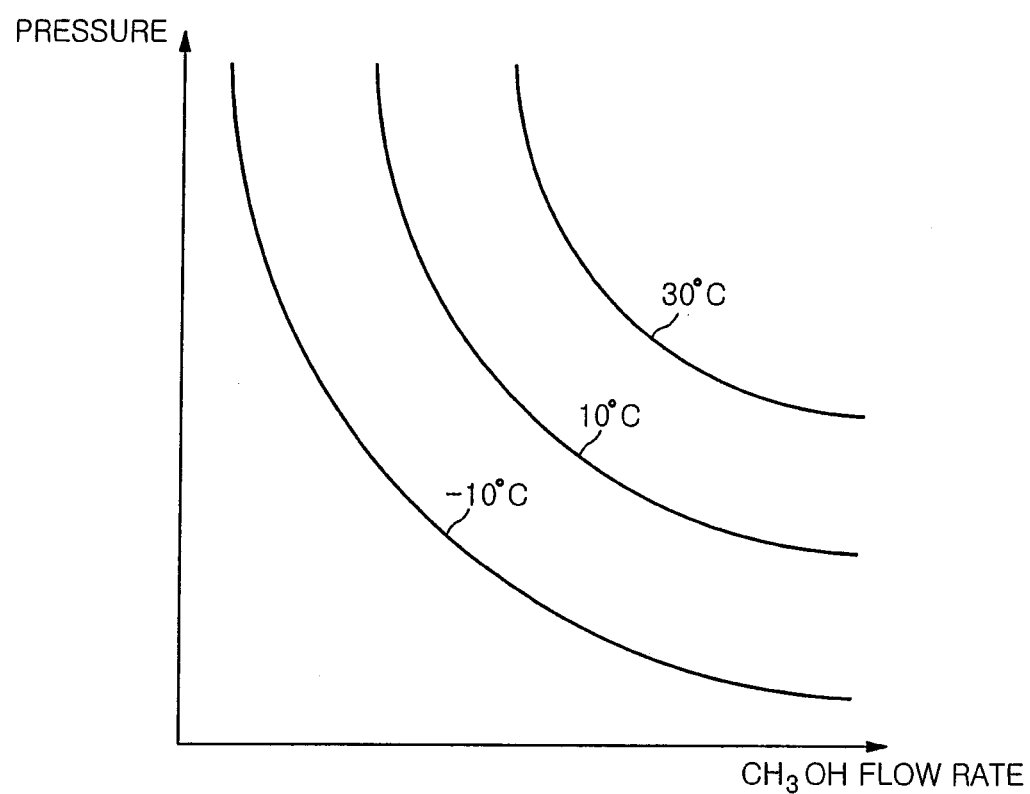
FIG. 8 is a graph showing relationship among a pressure at which deposits can be removed, a flow rate of a methanol gas, and a temperature.

From the above result, as illustrated in the graph of FIG. 8 in which the vertical axis indicates a pressure and the horizontal axis indicates a flow rate of the methanol gas, it is possible to determine, at each processing temperature, a boundary line that divides a region where the removal of deposits proceeds and a region where the removal of deposits does not proceed can be determined. Further, in the cycle treatment, the first period where the partial pressure of the methanol gas is set to a level in which deposits are removed and the second period where the partial pressure of the methanol gas is set to a level in which deposits are not removed can be set by changing the processing conditions (a pressure or a flow rate of the methanol gas or both) with respect to the boundary line.

While the embodiments and the test examples of the present invention have been described, the present invention may be variously modified without being limited to the above-described embodiments and test examples. For example, in the above-described embodiments and test examples, the case of using a methanol gas as an alcohol gas has been described. However, another alcohol gas, e.g., an ethanol gas, isopropyl alcohols gas or the like, may also be used.

INDUSTRIAL APPLICABILITY

The present invention can be used in a semiconductor device manufacturing field or the like, and thus has an industrial applicability.

DESCRIPTION OF REFERENCE NUMERALS

W: semiconductor wafer,
100: plasma processing apparatus,
101: processing chamber,
102: stage,
103: window,
104: RF coil,
105: gas inlet,
106: gas diffusion plate,
107: gas exhaust line,
200: gas processing apparatus,
201: processing chamber,
202: stage,
203: gas inlet,
204: opening,
205: through hole,
206: gas diffusion plate,
207: gas exhaust line.

What is claimed is:

1. A deposit removal method for removing deposits deposited on a surface of a pattern formed on a substrate during a shallow trench isolation process, the deposit removal method comprising:
   an oxygen plasma treatment process for exposing the substrate to an oxygen plasma while heating the substrate to a temperature set within a range from about 200° C. to 300° C.; and then
   a cycle treatment process for exposing the substrate to a gaseous mixture of hydrogen fluoride gas and alcohol gas in a processing chamber while repeating a first period and a second period alternately and maintaining the temperature of the substrate within a range from about 10° C. to 30° C.,
   wherein, in the first period, a partial pressure of the alcohol gas is set to a first partial pressure,
   wherein, in the second period, the partial pressure of the alcohol gas is set to a second partial pressure which is lower than the first partial pressure,
   wherein, in the cycle treatment process, the partial pressure of the alcohol gas is adjusted by controlling a pumping rate while supplying the gaseous mixture at a fixed flow rate throughout the first period and the second period,
   wherein, in the first period, a pressure in the processing chamber is set within a range from about 5 Torr to 7 Torr,
   wherein in the second period, the pressure in the processing chamber is set within a range from about 1.3 Torr to 5 Torr,
   wherein the first partial pressure is a partial pressure at which the deposit is removable by action of the gaseous mixture, and
   wherein each of the first and the second period is set to be about 5 to 20 seconds.

2. The deposit removal method of claim 1, wherein the deposit contains silicon oxide.

3. The deposit removal method of claim 1, wherein the pattern contains silicon dioxide as a structure.

4. The deposit removal method of claim 1, wherein the alcohol gas is a methanol gas.

5. The deposit removal method of claim 2, wherein the pattern contains silicon dioxide as a structure.

6. The deposit removal method of claim 2, wherein the alcohol gas is a methanol gas.

7. The deposit removal method of claim 3, wherein the alcohol gas is a methanol gas.

8. The deposit removal method of claim 1, wherein the controlling of the pumping rate is achieved by adjusting an opening degree of an automatic pressure controller.

\* \* \* \* \*